United States Patent
Wolff

(10) Patent No.: US 10,366,733 B1
(45) Date of Patent: Jul. 30, 2019

(54) WORD LINE CACHE MODE

(71) Applicant: Micron Technology, Inc., Boise, ID (US)

(72) Inventor: Gregg D. Wolff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/922,290

(22) Filed: Mar. 15, 2018

(51) Int. Cl.
G11C 7/22 (2006.01)
G11C 7/12 (2006.01)
G06F 12/0802 (2016.01)
G11C 8/08 (2006.01)

(52) U.S. Cl.
CPC ............ *G11C 7/22* (2013.01); *G06F 12/0802* (2013.01); *G11C 7/12* (2013.01); *G11C 8/08* (2013.01); *G06F 2212/60* (2013.01)

(58) Field of Classification Search
CPC ..... G11C 7/22; G11C 8/08; G11C 7/12; G06F 12/0802; G06F 2212/60
See application file for complete search history.

(56) References Cited

U.S. PATENT DOCUMENTS

| | | | |
|---|---|---|---|
| 6,549,452 B1* | 4/2003 | Park ...................... | G11C 11/418 365/154 |
| 2011/0261633 A1* | 10/2011 | Chandra ................ | G11C 8/08 365/189.15 |

* cited by examiner

*Primary Examiner* — Mohammed A Bashar
(74) *Attorney, Agent, or Firm* — Fletcher Yoder, P.C.

(57) ABSTRACT

Cache mode for word lines where the cache mode utilizes an internal timer for a memory cell to disable connection of a voltage to a transistor of a word line driver of the memory cell before an end of a specified end of period. By early disconnection, the local controls of the memory cell may provide additional time to settle after disconnection of the voltage without interfering with operations (e.g., read, write, activate) of the memory cell, since the internal timer may be programmed to be greater than or equal to a worst case scenario for the operations.

17 Claims, 7 Drawing Sheets

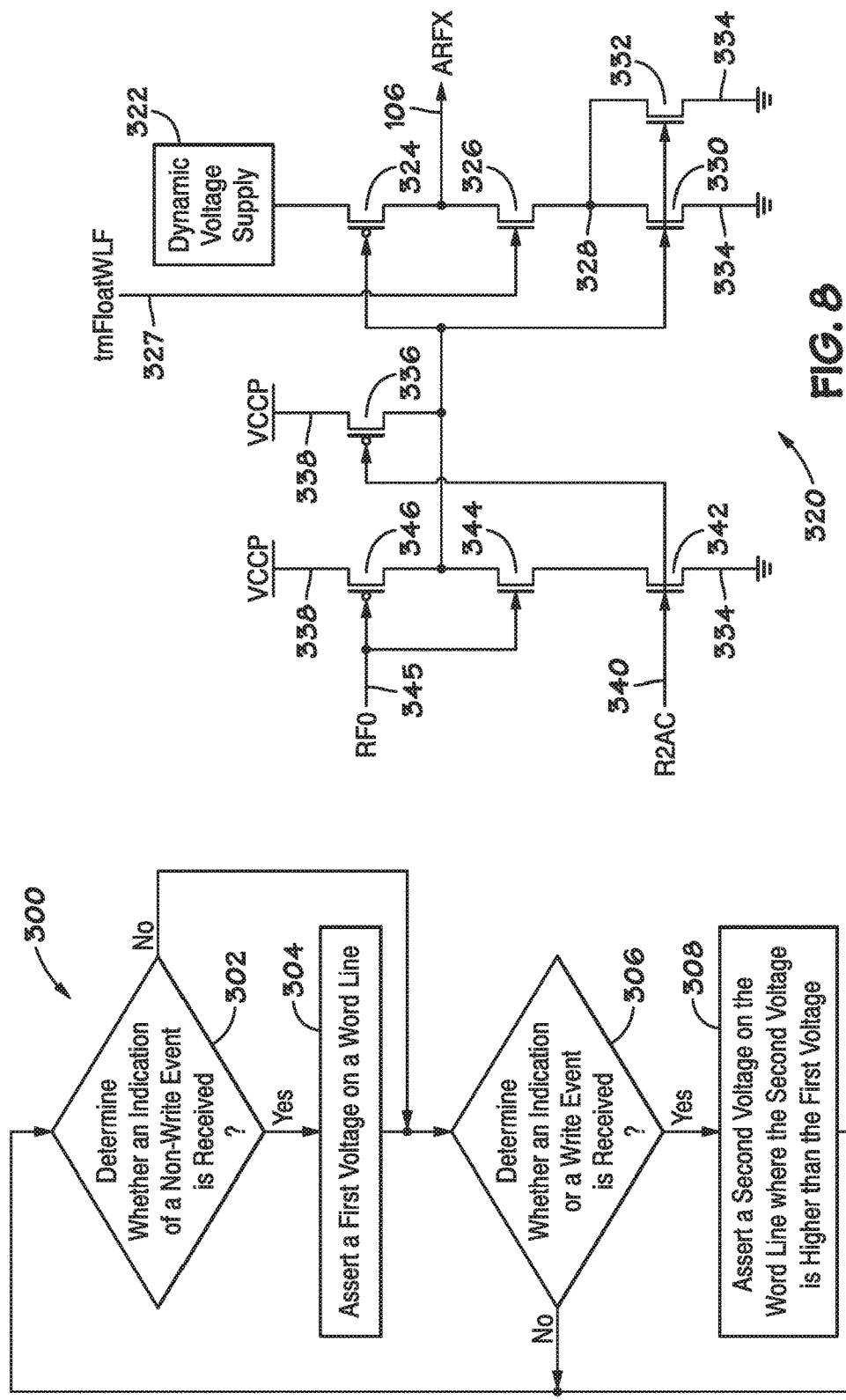

WORD LINE CACHE MODE

BACKGROUND

Field of the Present Disclosure

Embodiments of the present disclosure relate generally to the field of semiconductor devices. More specifically, embodiments of the present disclosure relate to a cache mode for word lines in memory devices.

Description of Related Art

Semiconductor devices (e.g., memory devices) often utilize word lines to access, read from, refresh, and/or write to memory cells. Due to the scaling of the memory cells in the memory devices, the word lines and/or its control circuitry may undergo various artifacts that inhibit function and/or cause power loss. For example, channel hot carrier (CHC) issues, row address strobe (RAS) clobber, and gate-induced drain leakage (GIDL) may occur in a word line driver. CHC and GIDL are issues that may arise in transistor operation of a word line driver due to voltages used in the word line driver. CHC negatively effects speed of performance of the word line driver, and GIDL reduces power efficiency of the word line driver. GIDL is current that leaks across a transistor due to an electric field between a gate and a drain of the transistor when the transistor is biased, and the drain bias is lower than a breakdown voltage. RAS clobber is stress applied to adjacent word lines by a word line being on for an extended duration.

Embodiments of the present disclosure may be directed to one or more of the problems set forth above.

BRIEF DESCRIPTION OF DRAWINGS

FIG. 7 is a flow diagram of a process for deploying the dynamic voltage of FIG. 6, according to an embodiment of the present disclosure;

FIG. 8 is a schematic view of a voltage driver that generates the dynamic voltage of FIG. 6, according to an embodiment of the present disclosure;

FIG. 10 is a flow diagram of a process for varying an output voltage of a dynamic power supply to the voltage driver of FIG. 8 based on write and non-write events, according to an embodiment of the present disclosure.

DETAILED DESCRIPTION

Figure 1:
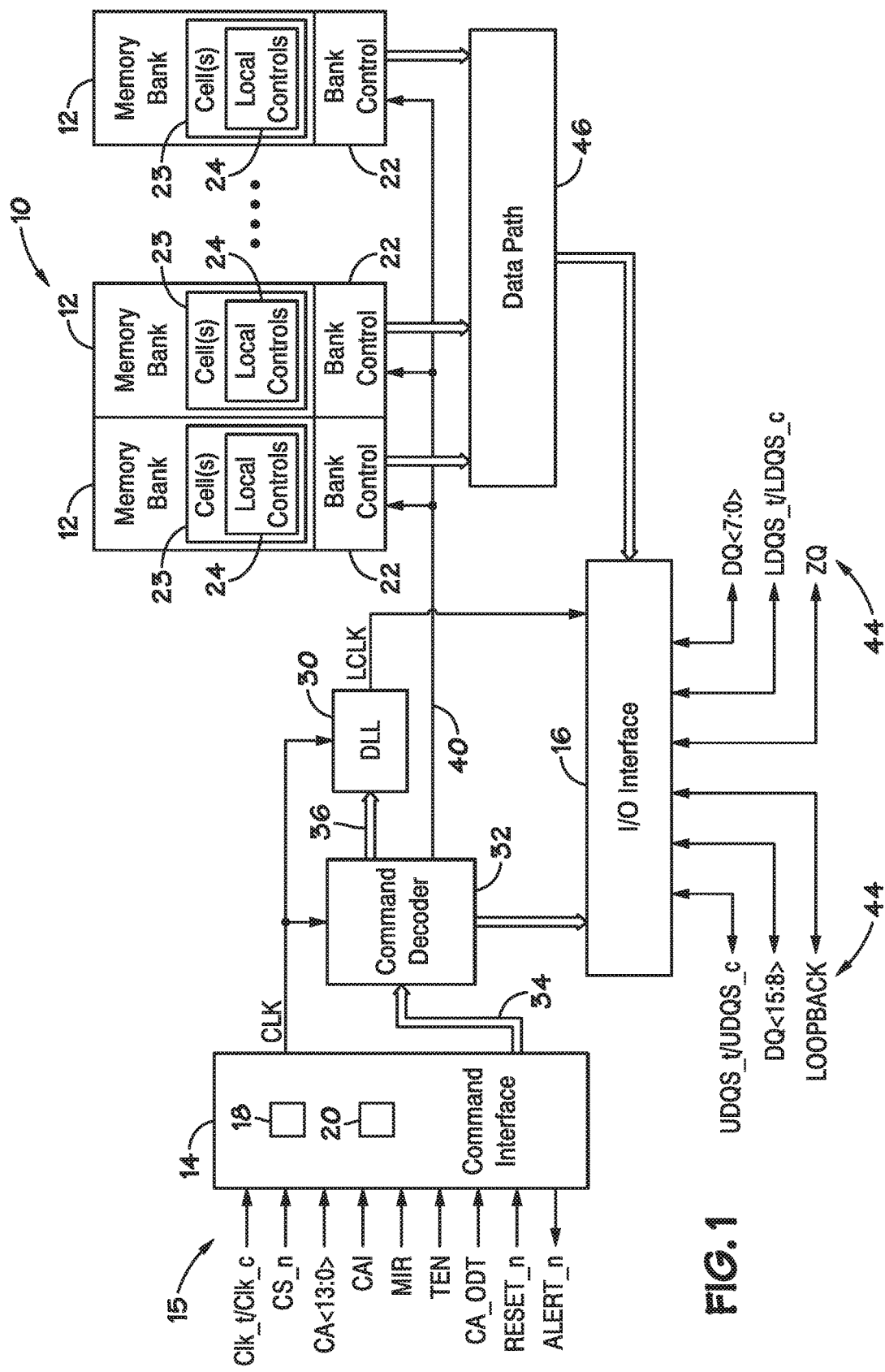
FIG. 1 is a simplified block diagram illustrating certain features of a memory device including local controls for memory cells of the memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Modern memory devices may have scaling factors that impose significant physical limitations on various aspects of the implementations. For example, a word line driver (and/or its related word lines) may experience capacitance-based performance issues due to close proximity between word lines. Furthermore, due to increasing operating speeds, greater voltages may be used on transistors to cause faster performance of the transistors.

However, these increased voltages may cause various issues, such as a channel hot carriers (CHC), row address strobe (RAS) clobber, and/or gate-induced drain leakages (GIDL). CHC and GIDL are issues that may arise in transistor operation of a word line driver due to increased voltage used in the word line driver. RAS clobber is stress applied to adjacent word lines by leaving a word line on for an extended duration. GIDL is current that leaks across a transistor due to an electric field between a gate and a drain of the transistor when the transistor is biased, and the drain bias is lower than a breakdown voltage. By leaving a word line on for an extended period, the word line can cause charge loss in adjacent word lines proportional to an on time of the word line.

The effects of these issues may be amplified due to a large number of word lines in the memory devices. For example, an active word line may be one of multiple (e.g., 64) word lines that use an arm signal. The word line may also use one of multiple (e.g., 8) phases of an ARFX voltage to drive the word line. Table 1 below illustrates the issues for activated and non-activated word lines in the memory device using an example 512 word lines using 64 word lines per arm signal with 8 ARFX voltage phases. However, these numbers are used to illustrative purposes, and the concepts depicted in Table 1 may be applicable to a memory device with any number of word lines sharing any number of arm signals and any number of ARFX voltage phases.

TABLE 1

Word lines and related issues arising in operation

| Word Line Active | ARM [1:64] | ARFX [1:8] | State | Number | Potential Issues |
|---|---|---|---|---|---|
| Activated Word Line | 0 | VCCP | On | 1 | RAS Clobber in physical neighbors, CHC when turning word line off |

TABLE 1-continued

Word lines and related issues arising in operation

| Word Line Active | ARM [1:64] | ARFX [1:8] | State | Number | Potential Issues |
|---|---|---|---|---|---|
| Same ARFX, Different ARM | VCCP | VCCP | Off | 63 | GIDL leakage |
| Same ARM, Different ARFX | 0 | 0 | Off | 7 | |
| Different ARM, ARFX | VCCP | 0 | Off | 441 | GIDL leakage |

As illustrated, an activated word line may be activated with a ground voltage on the arm signal and a high voltage of VCCP on the ARFX to turn the word line on. As illustrated, a single word line is activated that may cause issues in physically neighboring word lines. Furthermore, as discussed below, the activated word line my experience CHC issues when the activated word line is turned off. As illustrated in Table 1, 63 (or any other number) inactive word lines may share the ARFX phases with the activated word line. As discussed below, this sharing of the ARFX signal may cause GIDL leakage in these inactive word lines. Furthermore, as discussed below, other inactive word lines with different arm signals and different ARFX phases may also experience GIDL. Such issues do not only arise when a word line is activated. For example, when all of the word lines are to be inactive, all of the word lines may be subject to GIDL leakage.

A cache mode, as discussed below, may be used to mitigate these issues by at least partially removing direct word line control from external control and instead applying local controls to reduce and/or eliminate the effects of CHC, GIDL, and RAS clobber. The local controls may control timing of applied voltages and/or magnitudes of the applied voltages.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the bar clock signal (Clk_b). The positive clock edge for DDR refers to the point where the rising true clock signal Clk_t/crosses the falling bar clock signal Clk_b, while the negative clock edge indicates that transition of the falling true clock signal Clk_t and the rising of the bar clock signal Clk_b. Commands (e.g., read command, write command, etc.) are typically entered on the positive edges of the clock signal and data is transmitted or received on both the positive and negative clock edges.

The clock input circuit 18 receives the true clock signal (Clk_t/) and the bar clock signal (Clk_b) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, as discussed below, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

In some embodiments, one or more of the memory banks 12 may include one or more memory cell(s) 23 that have local controls 24 in addition to or in alternative to the external bank control 22. As will be discussed below, the internal local controls 24 may be used to control a duration of word line assertion and/or modify voltages used in memory operations (e.g., access, write, read, etc.).

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/and Clk_b). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the datapath 46, which includes a plurality of bi-directional data buses. Data TO signals, generally referred to as DQ signals, are generally transmitted and received in one or more bi-directional data busses. For certain memory devices, such as a DDR5 SDRAM memory device, the TO signals may be divided into upper and lower bytes. For instance, for a x16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/and Clk_b), the DQS signals may be provided as a differential pair of data strobe signals (DQS_t/and DQS_b) to provide differential pair signaling during reads and writes. For certain memory devices, such as a DDR5 SDRAM memory device, the differential pairs of DQS signals may be divided into upper and lower data strobe signals (e.g., UDQS_t/and UDQS_b; LDQS_t/and LDQS_b) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

As previously discussed, modern memory devices may have scaling factors that impose significant physical limitations on various aspects of the implementations. For example, a word line driver (and/or its related word lines)

may experience capacitance-based performance issues due to close proximity between word lines. Furthermore, due to increasing operating speeds, greater voltages may be used on transistors to cause faster performance of the transistors. However, these increased voltages may cause various issues, such as a channel hot carriers (CHC), row address strobe (RAS) clobber, and/or gate-induced drain leakages (GIDL). CHC and GIDL are issues that may arise in transistor operation of a word line driver due to increased voltage used in the word line driver. RAS clobber is stress applied to adjacent word lines by leaving a word line on for an extended duration. GIDL is current that leaks across a transistor due to an electric field between a gate and a drain of the transistor when the transistor is biased, and the drain bias is lower than a breakdown voltage. By leaving a word line on for an extended period, the word line can cause charge loss in adjacent word lines proportional to an on time of the word line. A cache mode, as discussed below, may be used to mitigate these issues by at least partially removing direct word line control from external control and instead applying local control 24.

Figure 2:
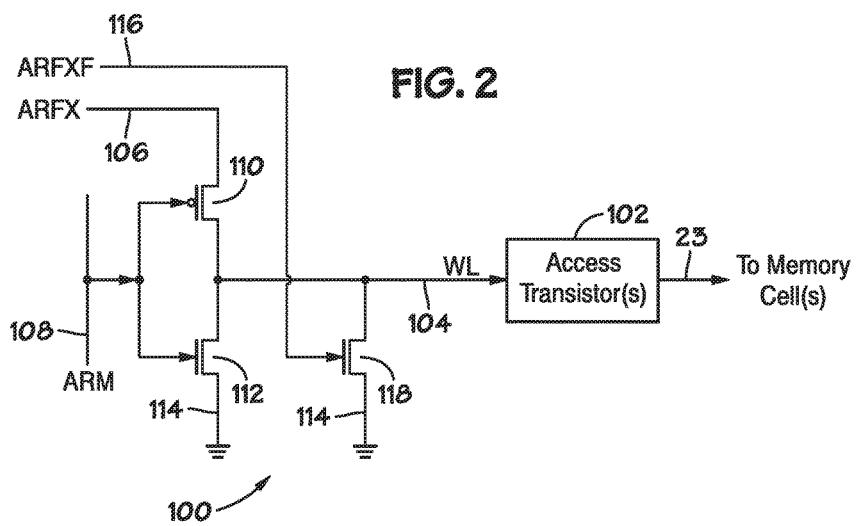
FIG. 2 is a schematic view of a word line driver, according to an embodiment of the present disclosure.

FIG. 2 illustrates an embodiment of a word line driver 100. The illustrated word line driver 100 provides voltages to an access transistor 102 that controls access to the memory cells 23 in the memory banks 12. In some embodiments, the access transistor(s) 102 may be omitted. In some embodiments, the word line driver 100 may be implemented in the local controls 24 of the memory banks 12. As illustrated, the word line driver 100 delivers the voltage via a word line 104. In an operating mode, the word line 104 may be driven to a voltage ARFX voltage 106. To achieve this output on the word line 104, an ARM 108 signal controls one or more word line connections to the ARFX voltage 106. In the illustrated embodiment, the ARM 108 signal, when low, couples the word line to ARFX voltage 106 through a p-channel transistor 110. Alternatively, when the ARM 108 signal is high, it causes an n-channel transistor 112 to couple the word line 104 to VSS 114. In some embodiments, an ARFXF voltage 116 may be complementary to the ARFX voltage 106 and be provided to a transistor 118 to ensure pulldown of the word line 104 to VSS 114 when the ARFXF voltage 116 is low.

CHC is a concern on the n-channel transistor 112 of the word line driver 100. CHC may result in a threshold voltage shift of the n-channel transistor 112, which will make the n-channel transistor 112 (the word line 104) slower to transition low from a high state. The degradation due to CHC is proportional to a drain-to-source voltage when the n-channel transistor 112 is turned on.

Figure 3:
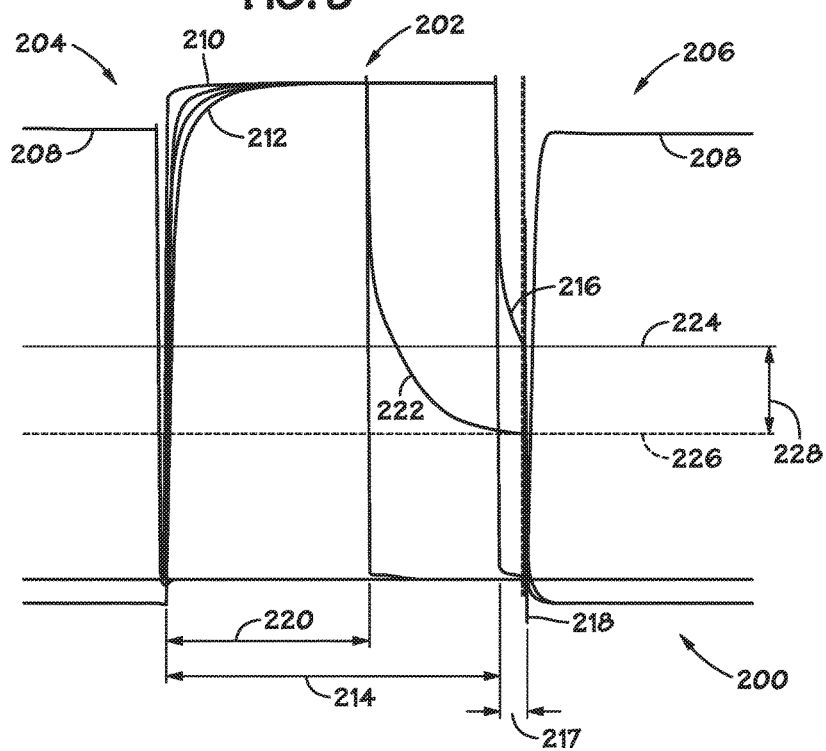
FIG. 3 is a graph showing a timer lockout using the word line driver of FIG. 2 when no write events have occurred, according to an embodiment of the present disclosure.

One way to address CHC and RAS clobber is to use a cache mode to ensure that the ARFX voltage 106 discharges on the word line 104 before the n-channel transistor 112 is next turned on by reducing a duration of assertion of the ARFX voltage 106 on the word line 104 to provide additional discharge time. FIG. 3 illustrates a graph 200 showing potential timing using the word line driver 100 when no write events have occurred. As illustrated, the graph 200 includes a high period 202 where the word line 104 has a high voltage. The high period 202 is between low periods 204 and 206. As illustrated, the low periods 204 and 206 include a high voltage for ARM 208 while the high period 202 includes a low voltage. Similarly, the high period 202 includes a high voltage for ARFX 210 and word line 212. As illustrated, when ARFX 210 is asserted for a duration 214, a settling 216 of the word line 212 may not be completed before ARM 208 transitions high at time 218. In other words, the settling 216 of the word line 212 may not be completed during a duration 217. As previously noted, elevation of the word line 212 above the VSS 114 when ARM 208 changes causes the n-channel transistor 112 to become more sluggish due to CHC.

Instead, as previously noted, direct control of the word line may be given to the local controls 24 rather than to external controls. Using the local control 24, a RAS timer may be used to control the word line 212 by reducing ARFX 210 before an end of the duration 214 where the duration 214 may be an externally asserted duration. For example, the duration 214 may be defined in a specification (e.g., DDR5 specification) for the memory device 10. The RAS timer may be set to a duration 220 where the duration 220 may be set greater than or equal to a worst-case scenario such as an activate-and-read operation. By setting the ARFX 210 low after the shorter duration 220, the local controls 24 provide additional settling time to enable settling 222 before the time 218. As illustrated, using the duration 214, results in a voltage 224 on the word line 212 when ARM 208 changes. Similarly, using the duration 220, results in a voltage 226 on the word line 212 when ARM 208 changes. A voltage difference 228 between the voltages 224 and 226 corresponds to a reduction in stress on the n-channel transistor 112. Furthermore, since the RAS period is reduced, the effect of the word line 212 on adjacent word lines due to RAS clobber is reduced.

Figure 4:
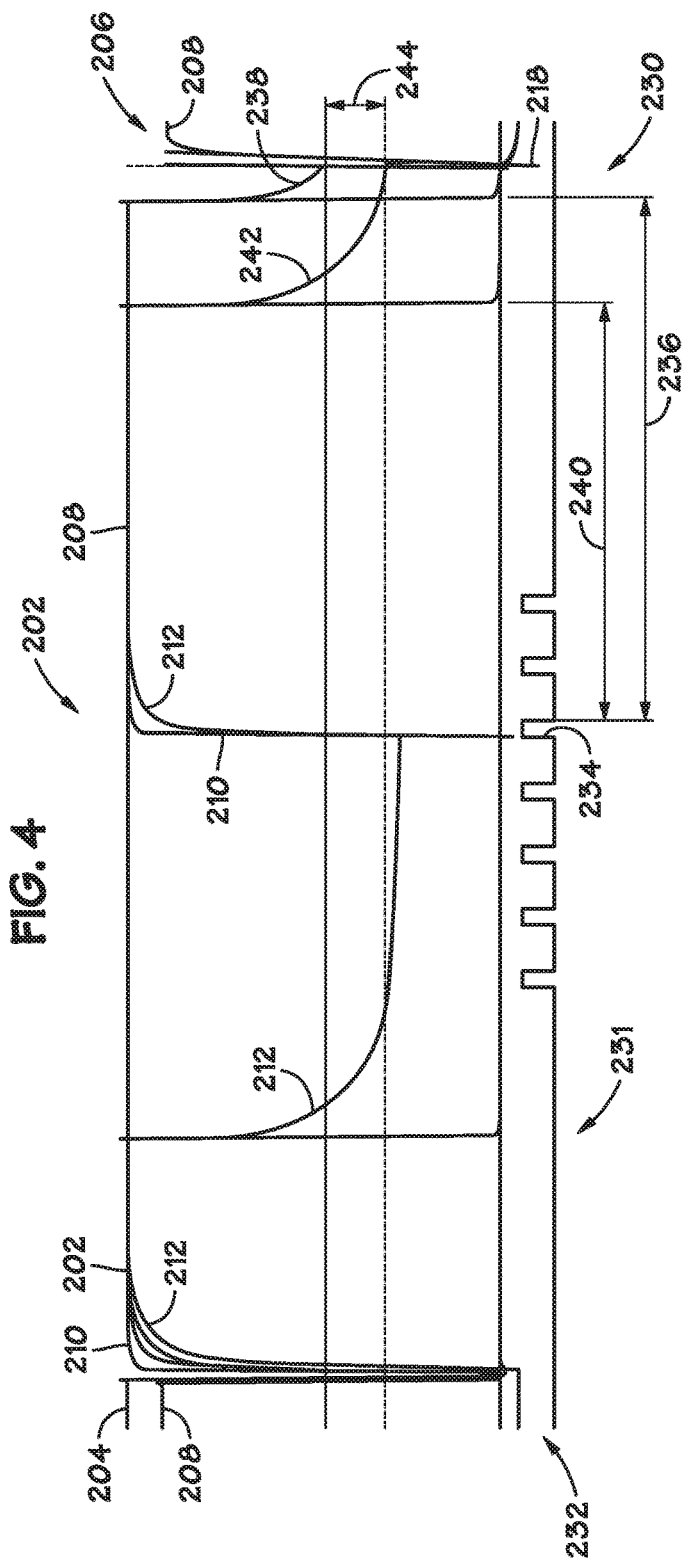
FIG. 4 is a graph that includes a write event after a timer lockout of FIG. 3, according to an embodiment of the present disclosure.

FIG. 4 illustrates a graph 230 that includes a write event after a tRAS lockout using the RAS timer illustrated in the graph 200 of FIG. 3. As illustrated, the graph 230 includes a tRAS lockout 231 similar to the graph 200 using the duration 220 to provide additional discharge time. However, in the graph 230, a write event 232 occurs. Due to the write event 232, the local controls 24 transition ARFX 210 (and word line 212) to high. Similar to the duration 214, a duration 236 for a write may not provide sufficient settling 238 before the time 218 resulting in an elevated drain-to-source voltage when the n-channel transistor 112 is switched on with ARM 208, thereby causing CHC. Thus, the local controls 24 may utilize a write recovery timer (tWR) to shorten assertion of high-voltage on the ARFX 210 to provide additional settling time. In other words, by reducing the duration 236 to the duration 240, a settling 242 of the word line 212 may use more time than the settling 222 to reduce CHC by reducing the voltage of the word line 212 at time 218 by a voltage difference 244 by using the duration 240 instead of the duration 236 provided by external controls.

Figure 5:
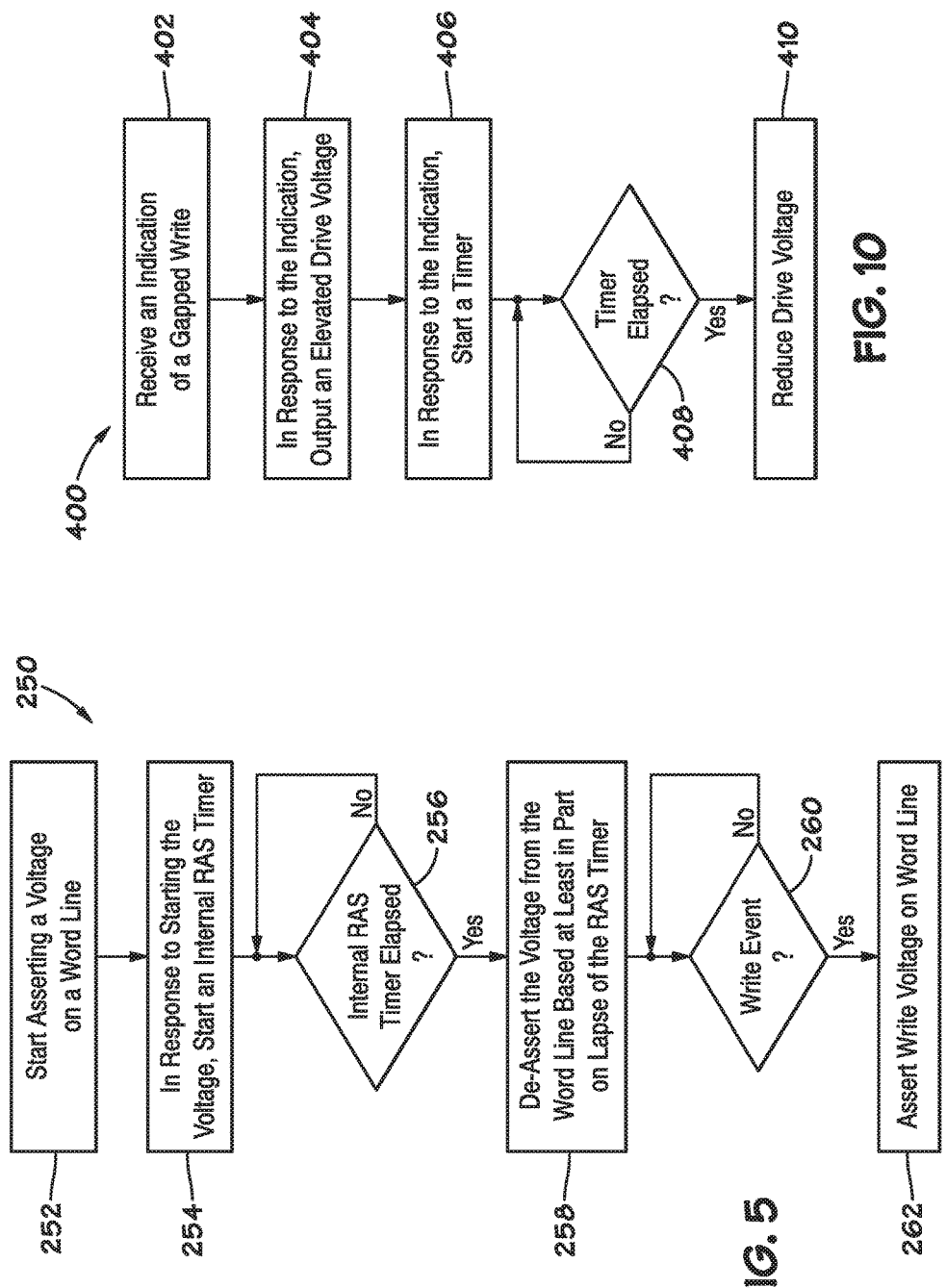
FIG. 5 is a flow diagram of a process for using local controls of FIG. 1 to implement a cache mode for the word line driver of FIG. 2, according to an embodiment of the present disclosure.

FIG. 5 illustrates a flow diagram of a process 250 for using the local controls 24 to implement a cache mode for the word line driver 100. The process 250 includes starting assertion of a voltage on the word line 104 (block 252). For example, ARM 108 may activate the transistor 110, and ARFX 106 may transition high. In response to this change, the local controls 24 start an internal RAS timer (block 254). As previously noted, the internal RAS timer may be set to a duration that is greater than or equal to a worst-case scenario for a non-write event but is shorter than an external duration for a read-and-activate operation. The local controls 24 determine whether the internal RAS timer has elapsed (block 256). Once the internal RAS timer has elapsed, the local controls 24 de-assert the voltage from the word line 104 based at least in part on the lapse of the internal RAS timer (block 258). This de-asserted period may be referred to as a tRAS lockout. The local controls 24 may determine whether a write event is received during the tRAS lockout (block 260). When a write event is received during the tRAS lockout, the local controls 24 assert a write voltage on the word line 104 (block 262). In some embodiments, the write voltage and the voltage asserted on the word line in block 252 are the same. Alternatively, the write voltage and the voltage asserted on the word line in block 252 are different. For example, the write voltage may be higher than the voltage asserted on the word line 104 since write operations are more sensitive to voltage levels.

In some embodiments, during the assertion of the write voltage, the local controls 24 may utilize a tWR to reduce a likelihood of potential CHC issues or RAS clobber during the write event and/or transition after the write event. In such embodiments, the local controls 24 utilize the tWR similar to the internal RAS timer to de-assert the write voltage before an externally specified (e.g., DDR5 external connections specification) time to de-assert the write.

As timing constraints become more stringent due to scaling of the memory device 10, a higher VCCP may be used to cause faster response in the word line 104 to meet timing constraints. These requirements may be even more restrictive for write operations that utilize a full rail-to-rail change rather than a half rail-to-rail change of a read and activate. However, if VCCP is increased for the word line driver 100, additional issues may arise, such as GIDL as previously discussed. To at least partially address GIDL issues, the local controls 24 may apply a lower VCCP for non-write operations, since non-write operations tend to be less sensitive to VCCP level. Furthermore, since non-write operations occur more frequently, a lower VCCP may be used a large portion of the time. Also, by using a lower VCCP level for non-write operations and boosting VCCP during a non-gapped write event enables the use ARM 108 to be kept at the lower VCCP to reduce/eliminate GIDL issues. Also, by reducing voltage of the ARM 108 while increasing ARFX for write operations, lower power may be used in the word line driver 100 without sacrificing time to implement a switching of the word line 104 on.

Figure 6:
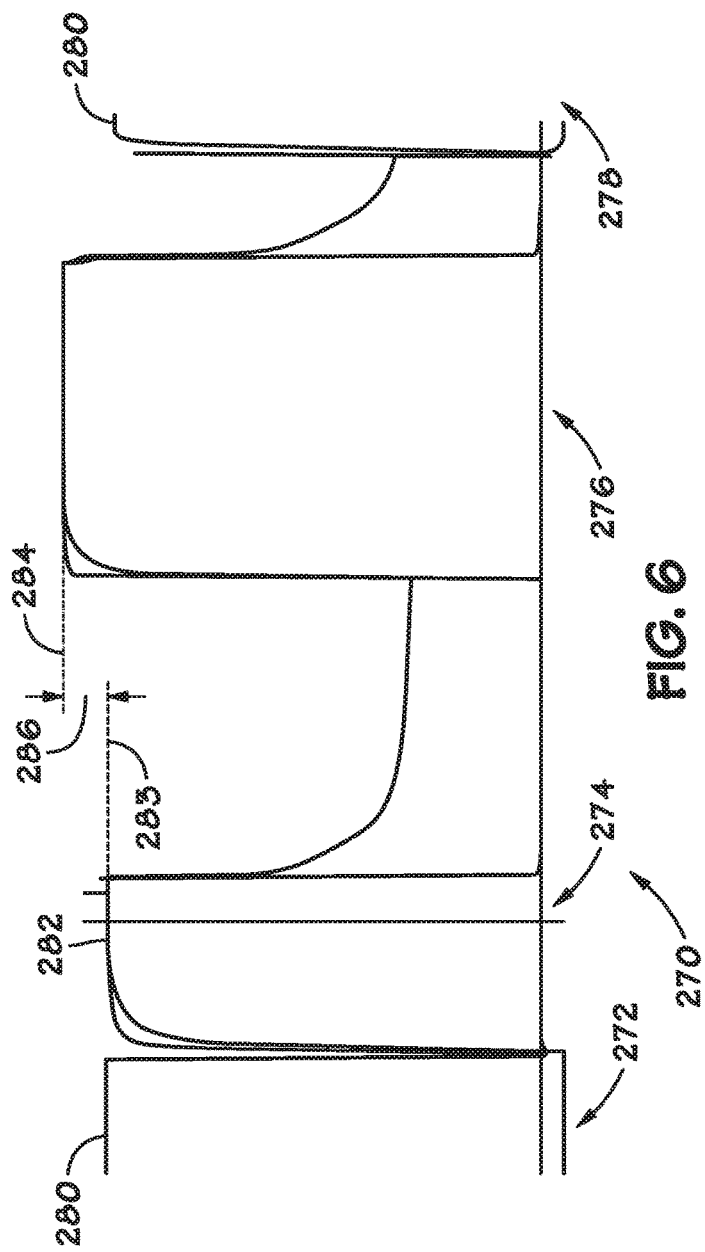
FIG. 6 is a graph of a dynamic voltage used in the word line driver of FIG. 2, according to an embodiment of the present disclosure.

FIG. 6 is a graph 270 that illustrates a dynamic ARFX voltage. The graph 270 illustrates an ARFX low period 272, a non-write (RAS) period 274, a write period 276, and an ARFX low period 278. As illustrated, an ARM 280 voltage may be at a logic high in the ARFX low periods 272 and 278. During the non-write period 274, a non-write operation is performed. Thus, an ARFX voltage 282 is set to a first level 283. During the write period 276, the ARFX voltage 282 is set to a second level 284 that is higher than the first level 283 to insure that a write may be performed within timing constraints.

FIG. 7 illustrates a flow diagram of a process 300 for deploying dynamic ARFX voltages. The local controls 24 determine whether an indication of a non-write operation is received (block 302). In some embodiments, an indication of a non-write operation is any operation using the word line 104 other than a write operation. In other words, as long as the word line 104 is active (e.g., ARM 108 toggles) and not writing (e.g., no write pulses), the non-write operation is indicated as active. In response to a receipt of the indication of the non-write operation, the local controls 24 assert a first voltage on the word line 104 (block 304). The local controls 24 determine whether an indication of a write operation is received (block 306). In some embodiments, the indication of the write operation may include ARM 108 toggling and write pulses received. Additionally or alternatively, a gapped write may be the indication. As used herein, a "gapped write" is a first non-pulse location in a write burst where a pulse does not occur after a train of regular pulses. In response to receiving the indication of the write operation, the local controls 24 assert a second voltage on the word line 104 (block 308). The second voltage is higher than the first voltage. In some embodiments, the local controls 24 may apply the RAS timer and the tWR timing previously discussed for shortening ARFX application during the write period 276 and/or the non-write period 274.

FIG. 8 illustrates an ARFX driver 320 that generates a dynamic ARFX 106 for the word line driver 100. The ARFX driver 320 toggles the ARFX 106 between a voltage from a dynamic voltage supply 322 that shifts between the first and second voltages of FIGS. 6 & 7. Specifically, the dynamic voltage supply 322 outputs the lower voltage by default and a gapped write initiates the dynamic voltage supply 322 outputting the higher voltage for a duration of the tWR (with or without internal tWR control durations). The ARFX driver 320 utilizes transistor 324 to couple the ARFX 106 to or decouple the ARFX 106 from the dynamic voltage supply 322. Similarly, the ARFX driver 320 utilizes a transistor 326 to couple the ARFX 106 to or decouple the ARFX 106 from a node 328. The transistor 326 may be controlled using a tmFloatWLF 327 that is applied to the gate of the transistor 326. The node 328, in turn, may use transistors 330 and 332 to be coupled to VSS 334 or to be decoupled from the VSS 334. Gates of the transistors 324, 330, and 332 may use a transistor 336 to couple to VCCP 338 or decouple from VCCP 338. The transistor 336 may be controlled using an R2AC signal 340 applied to a gate of the transistor 336. The R2AC signal 340 may also be used to control a transistor 342 that couples a transistor 344 to VSS 334 or decouples the transistor 344 from VSS 334. The transistor 344 may be controlled using a RF0 signal 345. The transistors 342 and 344, when activated, may couple the transistors 324, 330, and 332 to VSS 334. A transistor 346, when activated, may instead couple the transistors 324, 330, and 332 to VCCP 338. In summary, when the RF0 signal 345 is asserted high and the R2AC signal is asserted high, the transistor 324 may couple the ARFX signal 106 to the dynamic voltage supply 322.

Figure 9:
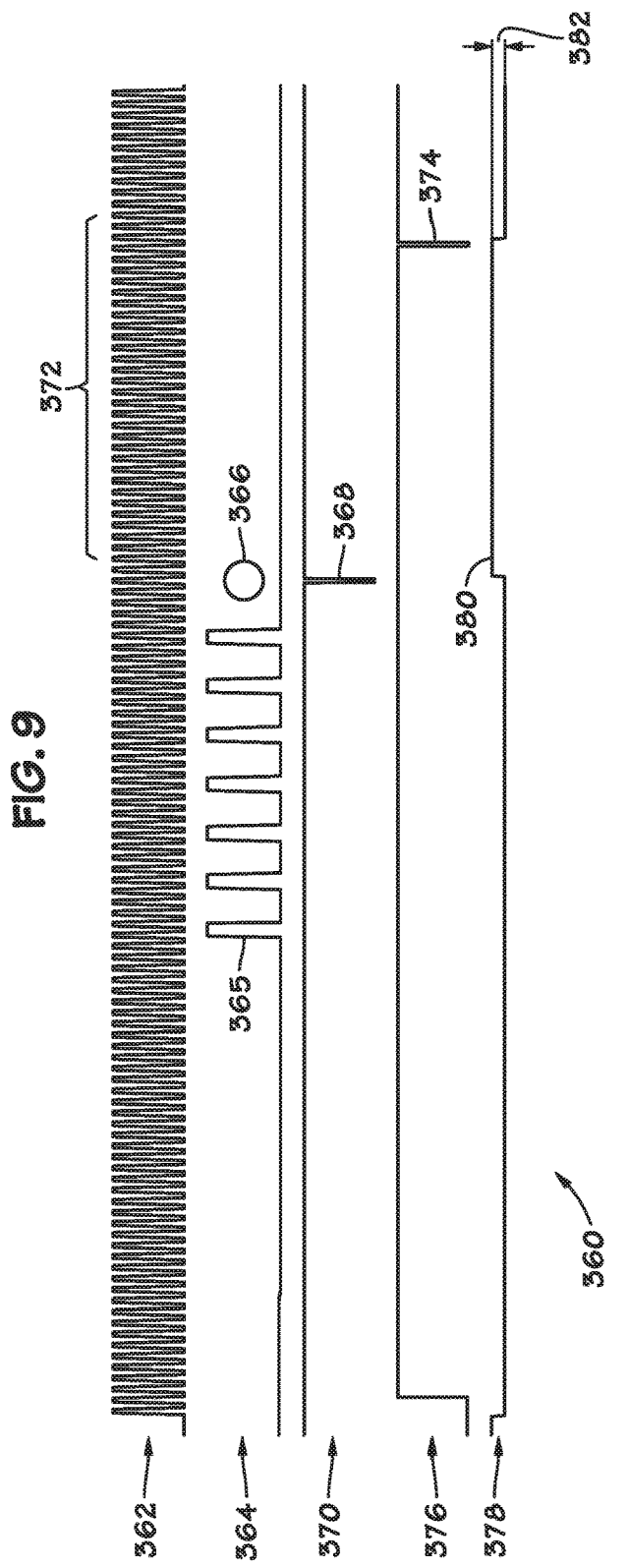
FIG. 9 is a graph of operation of a cache mode of the memory device of FIG. 1, according to an embodiment of the present disclosure.

FIG. 9 is a graph 360 illustrating an operation of the cache mode of the memory device 10 using local controls 24 with a write burst. The graph 360 includes a clock 362 and a write signal 364. The write signal 364 indicates gapless writes 365 followed by a gapped write 366, where a gapped write is a first period in a write burst where a pulse does not occur. The gapped write 366 causes a pulse 368 on a tWR timer start signal 370 that starts the tWR timer for a duration 372. As previously discussed, the duration 372 may be set greater than or equal to a worst case scenario (e.g., 30 ns) of the tWR operation but less than an external specification for the tWR operation. In some embodiments, the duration 372 for the tWR timer may be tunable for the memory device 10.

At the end of the duration 372, the local controls 24 may cause a pulse 374 on a tWR timer end signal 376 to indicate the end of the duration 372. The graph 360 also illustrates VCCP 378 from the dynamic voltage supply 322 of the ARFX driver 320. In other words, when the ARFX driver 320 is driving ARFX 106 to a logic high, the ARFX driver 320 drives ARFX 106 to the VCCP 378 level. As illustrated, VCCP 378 is at an elevated level 380 during the duration 372. As previously discussed, this elevated level 380 provides additional voltage 382 (e.g., 400 mV) to enable faster response of the word line driver 100 during write operations.

FIG. 10 illustrates a flow diagram of a process 400. The process 400 includes receiving an indication of a gapped write 366 at local controls 24 (block 402). As previously noted, the gapped write 366 may include a first interval in a chain of write pulses where a pulse does not occur. In some embodiments, the indication may include the pulse 368. The local controls 24, in response to the indication, cause an output of an elevated drive voltage (block 404). The elevated drive voltage may include the VCCP and/or ARFX 106 for use during the write operation. Using the elevated drive voltage, one or more word line drivers 100 may perform the write to one or more cells 23 using one or more respective word lines 104. Along with the elevated drive voltage, the local controls 24 start a tWR timer (block 406). As previously noted, the tWR timer may be set to a length (e.g., 30 ns) greater than or equal to a worst case scenario but less than external controls request due to a specification (e.g., DDR5). In some embodiments, the tWR may be tunable to any values within this window.

The local controls 24 monitor whether the tWR timer has elapsed (block 408). Once the tWR timer has elapsed, the local controls 24 cause the drive voltage to be reduced to a non-write level (block 410). In some embodiments, the local controls 24 may reset the tWR timer if another write event is received before the tWR timer has elapsed. Non-write events, such as reads and activates, may be performed with the reduced drive voltage using one or more word line drivers 100 through one or more respective word lines 104.

Although the foregoing discusses various logic-low and/or logic-high assertion polarities, at least some of these polarities may be inverted in some embodiments. Furthermore, in some embodiments, logic gates as discussed herein may be replaced with similar logical functions, such as an inverters and/or replacing n-channel with p-channel transistors or vice versa.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device comprising:
a plurality of memory cells;
a plurality of word lines that controls operations of the plurality of memory cells;
a plurality of word line drivers that each controls a respective word line of the plurality of word lines, wherein each word line driver of the plurality of word line drivers comprises:
a pull-up transistor to transition a corresponding word line to a logic high voltage; and
a pull-down transistor to transition the corresponding word line to a logic low voltage, wherein the pull-down transistor comprises an n-channel transistor that is activated during an inactive period for the corresponding word line; and local controls that each controls a respective word line driver of the plurality of word line drivers, wherein the local controls are configured to:
assert a voltage on the corresponding word line of the plurality of word lines;
start an internal timer responsive, at least in part, to assertion of the voltage, wherein the internal timer is configured to provide additional settling of the corresponding word line before activation to reduce channel hot carrier issues for the n-channel transistor;
determine whether the internal timer has elapsed; and
after the internal timer has elapsed, de-assert the voltage from the corresponding word line as a row address strobe timer (tRAS) lockout.

2. The semiconductor device of claim 1, wherein the internal timer is greater than or equal to a worst case scenario time for a non-write operation via the corresponding word line.

3. The semiconductor device of claim 2, wherein the internal timer is less than an external timer asserted according to a specification for the semiconductor device.

4. The semiconductor device of claim 1, wherein the local controls are configured to:
receive a write event during the timer lockout; and
assert a write voltage on the corresponding word line via the respective word line driver.

5. The semiconductor device of claim 4, wherein the write voltage and the voltage have the same magnitude.

6. The semiconductor device of claim 4, wherein the write voltage has a greater magnitude than the voltage has.

7. The semiconductor device of claim 4, wherein the local controls are configured to:
start an internal write timer responsive, at least in part, to assertion of the write voltage;
determine whether the internal write timer has elapsed; and
upon a lapse of the internal write timer, de-assert the write voltage from the corresponding word line.

8. The semiconductor device of claim 7, wherein a duration of the internal write timer is greater than or equal to a worst case scenario for timing for the write event.

9. A memory device comprising:
a memory cell;
a word line that controls memory operations on the memory cell;
a word line driver that controls the word line; and
a local control that controls the word line via the word line driver, wherein the local controls are configured to:
determine whether an indication of a non-write event is received;
upon receipt of the indication of the non-write event, cause the word line driver to assert a non-write voltage on the word line;
determine whether an indication of a write event is received; and
upon receipt of the indication of the write event, cause the word line driver to assert a write voltage on the word line, wherein the write voltage is greater than the non-write voltage; and
a dynamic voltage supply configured to:
provide the write voltage after a gapped write until a write timer has elapsed, where the gapped write is a first non-pulse location in a write burst where a pulse does not occur after a chain of write pulses; and
otherwise, provide the non-write voltage.

10. The memory device of claim 9, wherein the indication of the non-write event comprises:
a toggle of an arm signal in the word line driver; and
a lack of write pulses on a write signal.

11. The memory device of claim 9, wherein the indication of the write event comprises:
a toggle of an arm signal in the word line driver; and
a cessation of write pulses following one or more write pulses on a write signal.

12. The memory device of claim 9, wherein the local control comprises a voltage driver that selects a selected voltage from a low voltage, the non-write voltage, or the write voltage and causes the word line driver to drive the word line to the selected voltage.

13. The memory device of claim 12, wherein the local control comprises the dynamic voltage supply that alternates between providing the non-write voltage and providing the write voltage.

14. A memory device comprising:
at least one memory cell;
at least one word line coupled to the at least one memory cell; and
at least one local control that controls the word line and comprises a dynamic voltage supply, wherein the at least one local control is configured to:
receive an indication of a gapped write, wherein the gapped write is a first non-pulse location in a write burst where a pulse does not occur after a chain of write pulses;
in response to the indication, cause the dynamic voltage supply to output an elevated drive voltage;
in response to the indication, start an internal write timer;
determine whether the internal write timer has elapsed; and
in response to the internal write timer elapsing, cause the dynamic voltage supply to output a reduced drive voltage.

15. The memory device of claim 14, wherein the at least one local control comprises a voltage driver configured to select between the elevated drive voltage, the reduced drive voltage, and a low voltage.

16. The memory device of claim 15, wherein the at least one local control is configured to:
cause the voltage driver to output the reduced drive voltage during a non-write event;
start an internal non-write timer for the non-write event; and
after the internal non-write timer elapses, cause the voltage driver to output the low voltage.

17. The memory device of claim 15, wherein the at least one local control is configured to cause the voltage driver to:
cause the voltage driver to output the elevated drive voltage during a write event;
start an internal write timer for the write event; and
after the internal write timer elapses, cause the voltage driver to output the low voltage.

* * * * *